United States Patent [19]

Funakura

[11] Patent Number: 5,172,047

[45] Date of Patent: Dec. 15, 1992

[54] SEMICONDUCTOR TEST APPARATUS

[75] Inventor: Teruhiko Funakura, Itami, Japan

[73] Assignee: Mitsubishi Denki Kabushiki Kaisha, Tokyo, Japan

[21] Appl. No.: 644,634

[22] Filed: Jan. 23, 1991

[30] Foreign Application Priority Data

Aug. 31, 1990 [JP] Japan .................... 2-228016

[51] Int. Cl.$^5$ .................... G01R 31/28; G06F 11/00
[52] U.S. Cl. .................... 324/158 R; 324/73.1; 371/25.1; 371/68.3
[58] Field of Search ............ 371/68.3, 25.1; 324/73.1, 158 R, 115; 340/661

[56] References Cited

U.S. PATENT DOCUMENTS

| 4,102,491 | 7/1978 | DeVito et al. | 371/25.1 |
| 4,168,527 | 9/1979 | Winkler | 324/73.1 |
| 4,236,246 | 11/1980 | Skilling | 324/73.1 |
| 4,514,720 | 4/1985 | Oberstein et al. | 340/661 |
| 4,540,974 | 9/1985 | Schanne et al. | 324/115 |
| 4,656,632 | 4/1987 | Jackson | 324/73.1 |
| 4,775,977 | 10/1988 | Dehara | 371/27 |
| 4,862,071 | 8/1989 | Sato et al. | 371/25.1 |
| 4,882,584 | 11/1989 | Nakamura et al. | 324/115 |
| 4,908,576 | 3/1990 | Jackson | 371/25.1 |

OTHER PUBLICATIONS

"An Automated Test for High Resolution Analog-to-Digital and Digital-to-Analog Converters", by Souders et al, IEEE, Trans. on Instrum. & Meas., IM-28, #4, Dec. 1979, pp. 239–244.

"LSI Module Test Probe", by Stark, IBM Tech. Disc. Bull., vol. 21, #10, Mar. 1979, pp. 4157–4158.

Primary Examiner—Ernest F. Karlsen
Assistant Examiner—William J. Burns
Attorney, Agent, or Firm—Leydig, Voit & Mayer

[57] ABSTRACT

A semiconductor test apparatus for testing the characteristics of a semiconductor device having a plurality of output pins includes a plurality of level determination devices, arranged in correspondence with respective output pins of the semiconductor device, for determining the output levels from corresponding output pins, a data preparation device for preparing combination data by selectively combining the outputs of the plurality of level determination devices, a retaining device for retaining combination data prepared by the data preparation device, at least two storage devices, each for storing set values, at least two comparison devices, arranged in correspondence with respective storage devices, each for comparing combination data retained in the retaining device with the set values stored in the corresponding storage devices, and a determination device for determining the characteristics of the semiconductor devices from the comparison results of the comparison devices.

4 Claims, 5 Drawing Sheets

12# SEMICONDUCTOR TEST APPARATUS

BACKGROUND OF THE INVENTION

1. Field of the Invention

The present invention relates to a semiconductor test apparatus for testing the logic characteristics of a semiconductor device.

2. Description of the Related Art

An essential portion of a conventional semiconductor test apparatus is shown in FIG. 3. Logical decision sections $1a$ to $1e$ each are correspondingly connected to a plurality of output pins $2a$ to $2e$ of a semiconductor device 2 to be tested. Each of the logical decision sections $1a$ to $1e$ has a high-level output comparator $3a$ and a low-level output comparator $3b$ which are connected to corresponding output pins of the semiconductor device 2, flip flops $5a$ and $5b$ are respectively connected to these comparators $3a$ and $3b$, an OR circuit 6 is connected to the flip flops $5a$ and $5b$, and a comparison circuit 7 is connected to the OR circuit 6. The output of the comparison circuit 7 of each of the logical decision sections $1a$ to $1e$ is connected to an OR circuit 8.

Next, the operation of the apparatus shown in FIG. 3 will be explained. The output from each of the output pins $2a$ to $2e$ of the semiconductor device 2 is output to the comparators $3a$ and $3b$ of the logical decision sections $1a$ to $1e$. If the output from the output pins $2a$ to $2e$ is higher than a predefined value $V_{oH}$ which has been preset in the high-level output comparator $3a$, the outputs from the comparators $3a$ and $3b$ both become high level outputs. Conversely, if that output is lower than a predefined value $V_{oL}$ which has been preset in the low-level output comparator $3b$, the outputs from the comparators $3a$ and $3b$ both become low level outputs. These outputs from the comparators $3a$ and $3b$ are retained in the flip flops $5a$ and $5b$, respectively, in accordance with a strobe signal $S_{ST}$ generated at a preset time, and then input to the comparison circuit 7 through the OR circuit 6. An expected level indicating what the output level from the corresponding output pins of the semiconductor device 2 should be at the time when a strobe signal $S_{ST}$ is generated is stored beforehand in the comparison circuit 7. The comparison circuit 7 compares the output level of the OR circuit 6 with the expected level, and outputs a low-level signal if these levels match each other and outputs a high-level signal if these levels do not match.

Signals output from the comparison circuit 7 of each of the logical decision sections $1a$ to $1e$ are input to the OR circuit 8. When all the output levels of the output pins $2a$ to $2e$ of the semiconductor device 2 match the expected levels, a low-level output is obtained from the OR circuit 8. If at least one of the output levels differs from the expected level, a high-level output is obtained.

The testing of the semiconductor device 2 has been performed in the above way.

FIG. 4 shows a semiconductor device 20 with a 4-bit A/D conversion function and a function of retaining its digital values. An analog value input to an analog waveform input pin 9 is converted to a digital value by means of an A/D converter 10. That digital value is retained in a latch circuit 12 at the time when a trigger is input to a trigger input pin 11. For example, when an analog value of 4 V is input to the input pin 9 at trigger input time, data of bits 0 to 3 output from output pins $20a$ to $20d$ become low level, low level, high level, and low level, respectively. Thus, $0100_2$, which is a binary representation of $4_{10}$ in the decimal representation, is the expected output of the semiconductor device 20. Consequently, if data $0100_2$ is output from the semiconductor device 20 in response to the above trigger input when the testing of the semiconductor device 20 is carried out by using the test apparatus shown in FIG. 3, the output of the OR circuit 8 becomes a low level output, which indicates that the operation of the semiconductor device 20 is normal.

However, if the precision of the A/D converter 10 contained in the semiconductor device 20 is assumed to be $\pm 2$LSB, it is necessary that this semiconductor device 20 be determined to be normal even when the output from the semiconductor device 20 is $0010_2(2_{10})$, $0011_2(3_{10})$, $0101_2(5_{10})$, and $0110_2(6_{10})$ in addition to $0100_2(4_{10})$. However, in the conventional test apparatus shown in FIG. 3, only one of a high or a low level can be set for an expected level from each of the output pins of the semiconductor device 2 at strobe signal $S_{ST}$ input time. For this reason, as in the semiconductor device 20 shown in FIG. 4, when whether the device 20 is nondefective or defective is determined by a combination of the output levels from a plurality of output pins $20a$ to $20d$, a plurality of tests are carried out by varying expected values consisting of a combination of expected levels for the respective output pins $20a$ to $20d$. When at least one output block of data matches the expected value in the plurality of these tests, the semiconductor device is determined to be nondefective.

The flowchart of the testing in this case is shown in FIG. 5. First, a minimum $0010_2$ from among a plurality of expected values is assumed to be an initial expected value DATA in step S1. This expected value DATA is set in a test apparatus in step S2, and the test is performed in step S3. In step S4, it is determined whether or not the result of the test shows "defective". When it is not defective, a flag is set to 1 in step S5, then in step S6 the number of tests is checked. If the result of the determination in step S4 is "defective", the process proceeds directly to step S6. If it is determined in step S6 that this is not a fifth test, the expected value DATA is incremented by 1 in step S7. For example, if the expected value DATA up to the present time is $0010_2$, this value is modified to $0011_2$, and the process returns to step S2, and steps S2 to S6 are repeated again.

When five tests are completed in the above way, it is checked in step S8 whether or not the flag is 1. If the flag is 1, then it is determined in step S9 that the semiconductor device 20 is nondefective; if not 1, it is determined in step S10 that the semiconductor device 20 is defective.

From the above procedure, when the output of the semiconductor device 20 is from $0010_2(2_{10})$ to $0110_2(6_{10})$, the semiconductor device 20 is determined to be nondefective.

As described above, in the conventional semiconductor test apparatus, when expected values of a wide range exist from a combination of each level of a plurality of output pins of a semiconductor device, a plurality of similar tests must be carried out. That is, a problem exists in that testing requires a long period of time.

SUMMARY OF THE INVENTION

The present invention has been devised to solve the above-mentioned problems. An object of the present invention is to provide a semiconductor test apparatus which tests semiconductor devices in a short time even when expected values of a wide range exist.

A semiconductor test apparatus of the present invention for testing the characteristics of a semiconductor device having a plurality of output pins comprises: a plurality of level determination devices, arranged in correspondence with respective output pins of a semiconductor device, being tested for determining the output level from corresponding output pins; a data preparation device for preparing combination data by selectively combining the outputs of the plurality of level determination devices; a retaining device for retaining the combination data prepared by the data preparation device; at least two storage devices each for storing set values; at least two comparison devices, arranged in correspondence with the respective storage devices, for comparing combination data retained in the retaining device with set values stored in the corresponding storage means; and a determination device for determining the characteristics of the semiconductor device from comparison results in the comparison devices.

In the present invention, a data preparation means prepares combination data by selectively combining the output levels of a semiconductor device determined by a plurality of level determination means. Each comparison means regards this combination data item as one data and compares this single data item with a set value stored in a corresponding storage means.

DESCRIPTION OF THE PREFERRED EMBODIMENT

An embodiment of the present invention will be explained hereinunder with reference to the accompanying drawings.

Figure 1:
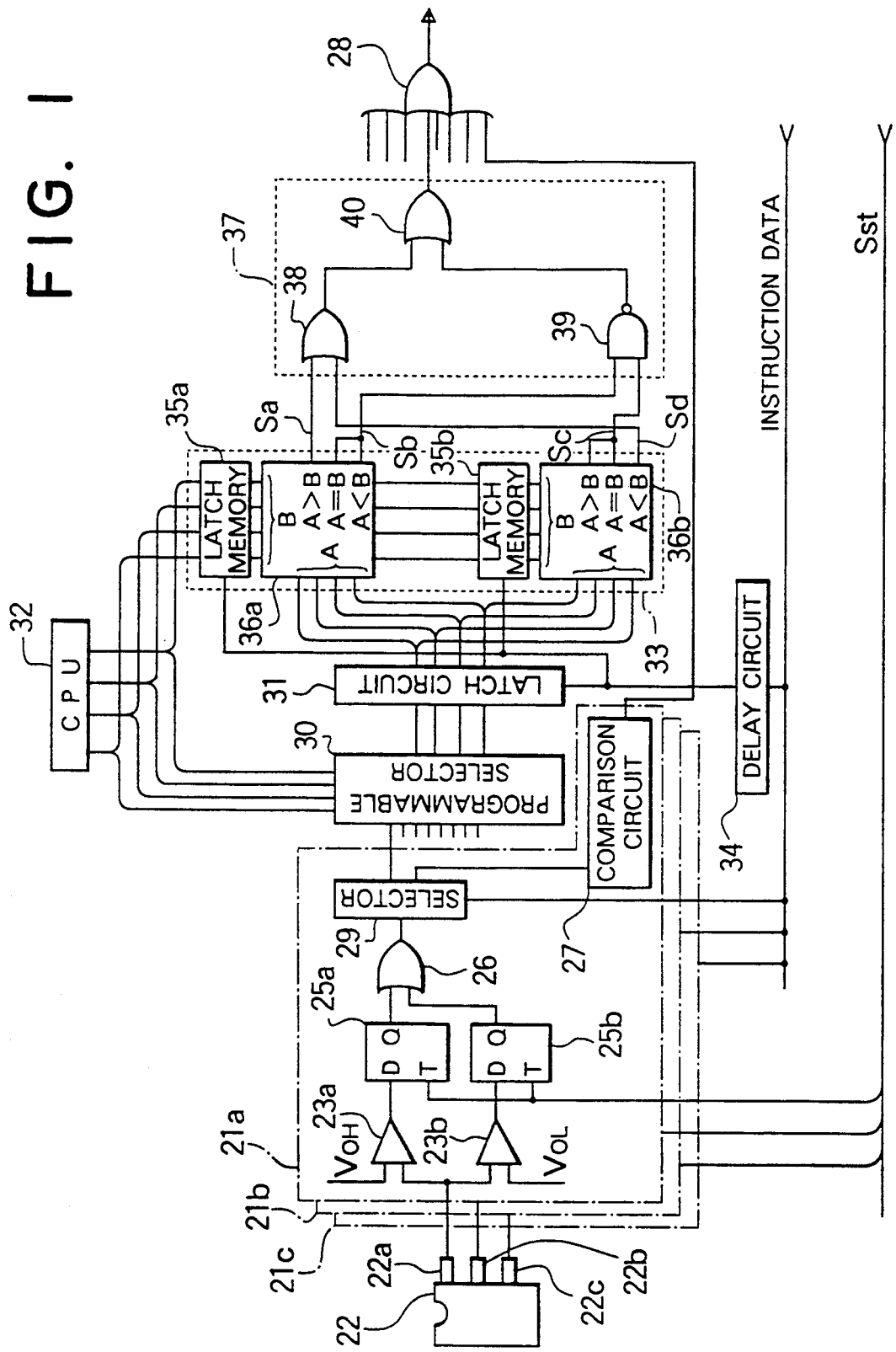
FIG. 1 is a block diagram showing a portion of a semiconductor test apparatus according to an embodiment of the present invention.

In FIG. 1, logical decision sections 21a to 21c are correspondingly connected to a plurality of output pins 22a to 22c of a semiconductor device 22 to be tested. Each of the logical decision sections 21a to 21c has a high-level output comparator 23a and a low-level output comparator 23b which are connected to a corresponding output pin of the semiconductor device 22, flip flops 25a and 25b respectively connected to these comparators 23a and 23b, an OR circuit 26 connected to the flip flops 25a and 25b, a selector 29 connected to the OR circuit 26, and a comparison circuit 27 connected to the selector 29.

A programmable selector 30, which serves as a combination data preparation means, is connected to the selector 29 of each of the logical decision sections 21a to 21c. A CPU 32, and a latch circuit 31, which serves as a retaining means, are connected to the programmable selector 30. In addition, a comparison section 33 and a delay circuit 34 are connected to the latch circuit 31. The comparison section 33 has latch memories 35a and 35b, connected to the CPU 32, which serve as a storage means, and comparison circuits 36a and 36b respectively connected to these latch memories 35a and 35b. The comparison circuits 36a and 36b are magnitude comparators and are part of a comparison means.

A decision section 37, which serves as a decision means, is connected to the comparison circuits 36a and 36b of the comparison section 33. The decision section 37 has an OR circuit 38 and a NAND circuit 39 connected to the comparison circuits 36a and 36b, and an OR circuit 40 connected to the OR circuit 38 and the NAND circuit 39. An OR circuit 28 is connected to the OR circuit 40 of the decision section 37 and to the comparison circuit 27 of each of the logical decision sections 21a to 21c.

The comparators 23a and 23b, the flip flops 25a and 25b, and the OR circuit 26 in each of the logical decision sections 21a to 21c are part of a level judgment means.

Although not shown, in addition to the circuits shown in FIG. 1, a supply circuit for supplying test patterns to the semiconductor device 22 in accordance with a test program is provided.

Next, the operation of this embodiment will be explained. First, a predetermined test pattern is supplied to the semiconductor device 22 from an unillustrated supply circuit, and thus the semiconductor device 22 is operated. The output from each of the output pins 22a to 22c of the semiconductor device 22 is input to the comparators 23a and 23b of the corresponding logical decision sections 21a to 21c, respectively. If the output from the output pins 22a to 22c is higher than a predefined value $V_{oH}$ which has been preset in the high-level output comparator 23a, the outputs from the comparators 23a and 23b both become high level outputs. Conversely, if that output is lower than a predefined value $V_{oL}$ which has been preset in the low-level output comparator 23b, the outputs from the comparators 23a and 23b both become low level outputs. These outputs from the comparators 23a and 23b are retained in the flip flops 25a and 25b, respectively, in accordance with a strobe signal $S_{ST}$ generated at a preset time and input to the selector 29 through the OR circuit 26.

Figure 3:
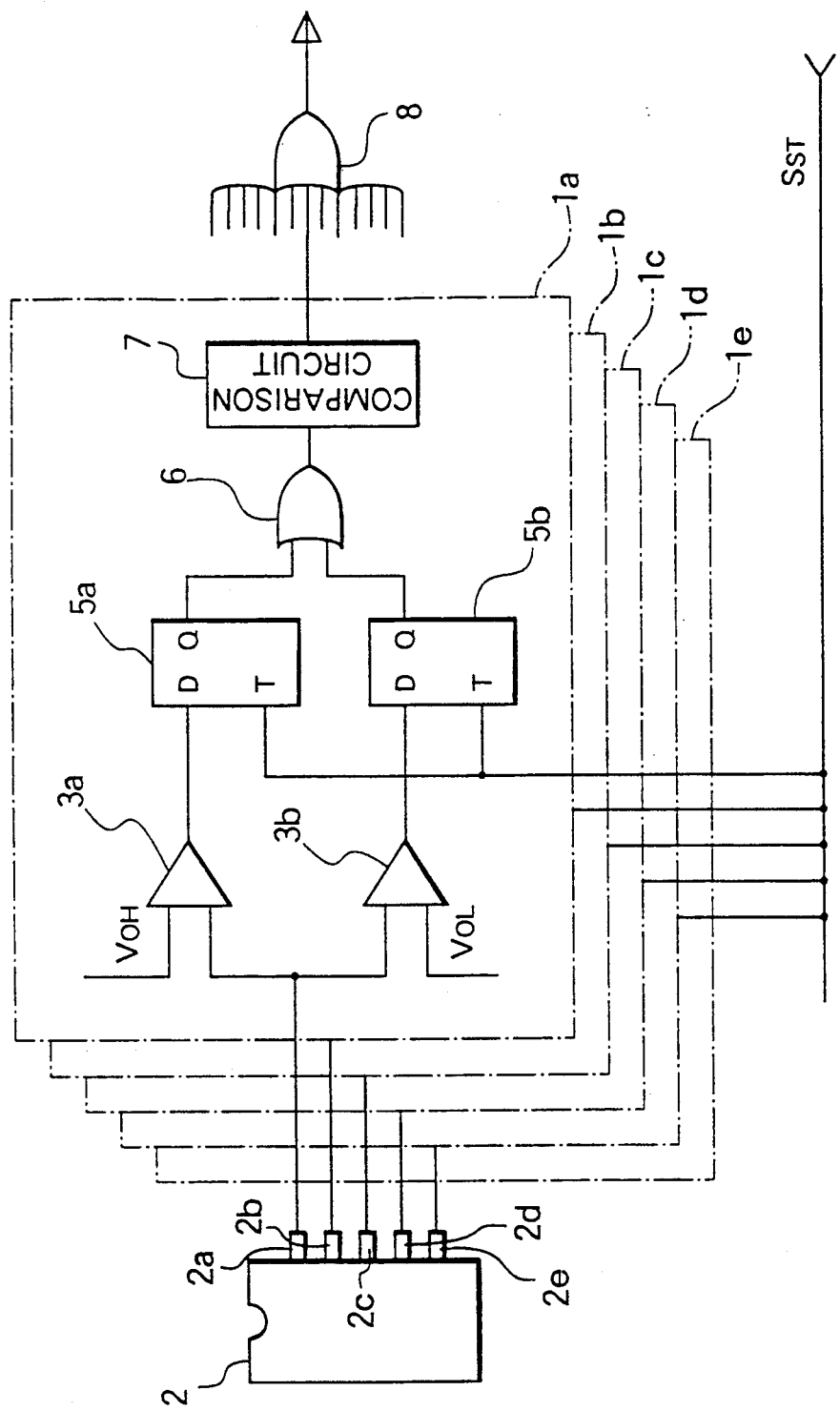
FIG. 3 is a block diagram showing an essential portion of a conventional semiconductor test apparatus.
Figure 4:
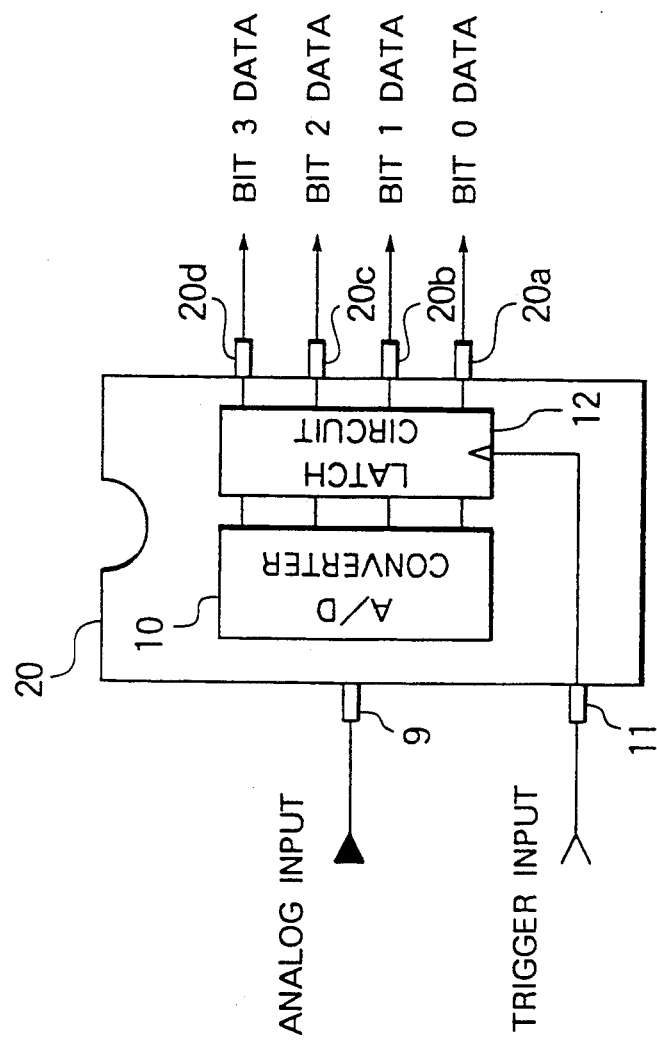
FIG. 4 is a block diagram showing an example of a semiconductor device.
Figure 5:
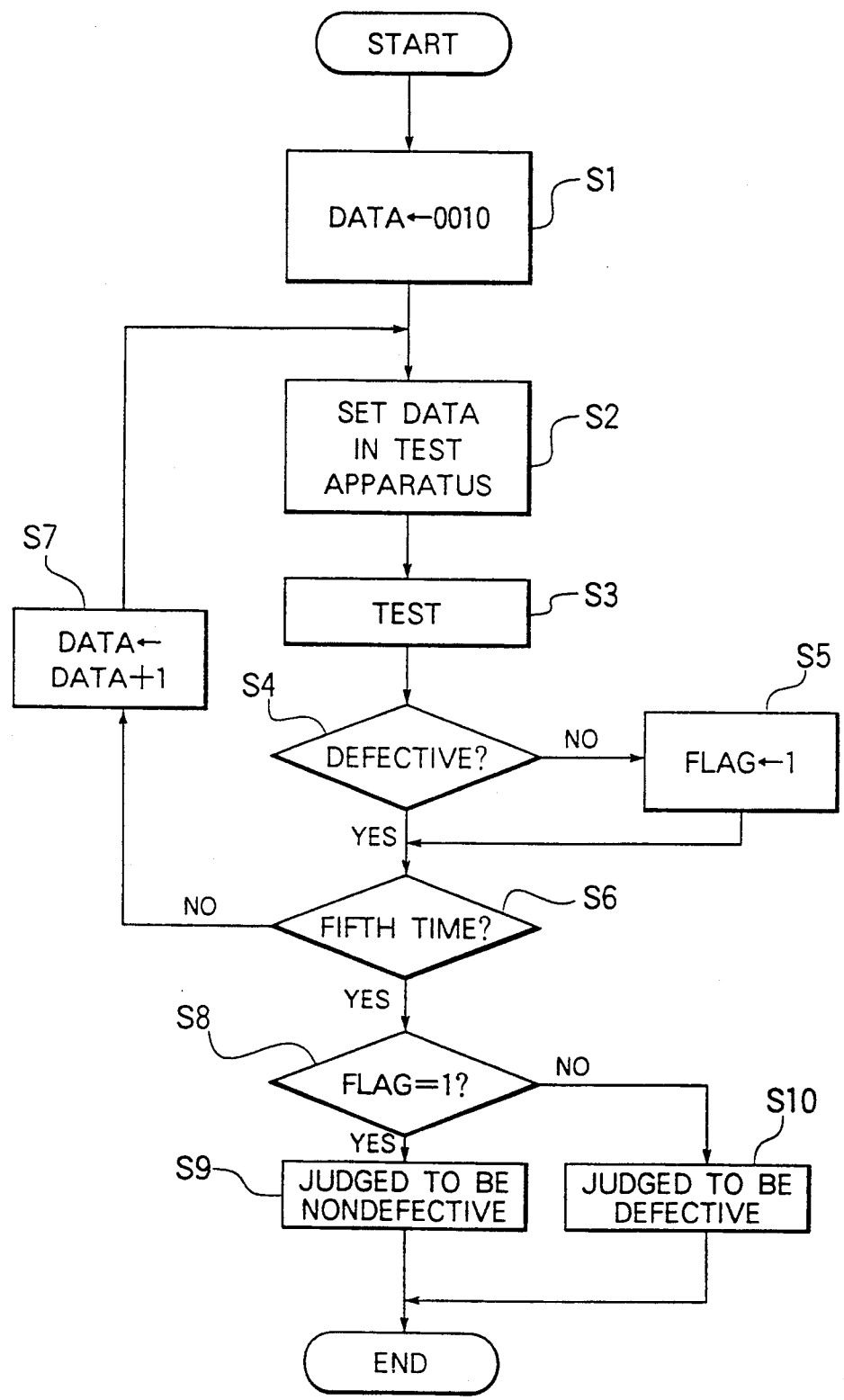
FIG. 5 is a flowchart showing a testing procedure according to the conventional semiconductor test apparatus.

To the selector 29 is input instruction data (control command) specifying whether the testing of this semiconductor device 22 is either one of usual tests for specific expected values having no range or a special test for expected values having a certain range as a precision check of the A/D converter 10 of the semiconductor device 20 shown in FIG. 4. When instruction data indicating a usual test is input, the selector 29 selects the comparison circuit 27 disposed in its own logical decision section and connects it to the OR circuit 26. Conversely, when instruction data indicating a special test is input, the selector 29 selects the programmable selector 30 and connects it to the OR circuit 26. In the case of a usual test, the same operation as in the conventional test apparatus shown in FIG. 3 is performed. That is, the OR circuit 26 is connected to the comparison circuit 27. The comparison circuit 27 compares its own expected level beforehand stored therein with the output level of the OR circuit 26. If they match each other, the comparison circuit 27 outputs a low-level signal; if not, a high-level signal is output. A signal output from the comparison circuit 27 of each of the logical decision sections 21a to 21c is connected to the OR circuit 28, with the result that if all output levels from the output pins 22a to 22c of the semiconductor device 22 match the expected levels, a low-level output is obtained from the OR circuit 28; if at least one of the output levels differs from an expected level, a high-level output is obtained.

On the other hand, in the case of a special test, the programmable selector 30 is selected by the selector 29 of each of the logical decision sections 21a to 21c. Each of the outputs of the OR circuit 26 is input to the programmable selector 30. That is, data from all the output pins 22a to 22c of the semiconductor device 22 is input to the programmable selector 30. This programmable selector 30 selects data specified by a combination instruction input from the CPU 32 from among data from the the output pins 22a to 22c of the semiconductor device 22 and prepares combination data by combining these selected data.

The combination data prepared by the programmable selector 30 is retained in the latch circuit 31 with instruction data whose input is delayed by a predetermined time by the delay circuit 34, as a trigger, and then that data is input to a respective A data input terminal of each of the comparators 36a and 36b in the comparison section 33.

A first set value indicating an upper limit value used for a determination and a second set value indicating a lower limit value used a determination are beforehand stored in the latch memories 35a and 35b, respectively by the CPU 32. The first set value and the second set value are input to a respective B data input terminal of each of the comparison circuits 36a and 36b with instruction data whose input is delayed by the predetermined time by the delay circuit 34, as a trigger.

The comparison circuit 36a compares its own A data input value $V_A$ with its own B data input value $V_B$. When $V_A > V_B$, output signals Sa and Sb are assumed to be a high level signal and a low level signal, respectively; when $V_A \leq V_B$, output signals Sa and Sb are assumed to be a low level signal and a high level signal, respectively. The other comparison circuit 36b compares its own A data input value $V_A$ with its own B data input value $V_B$. When $V_A \geq V_B$, output signals Sc and Sd are assumed to be a high level signal and a low level signal, respectively; when $V_A < V_B$, output signals Sc and Sd are assumed to be a low level signal and a high level signal, respectively.

Consequently, when the combination data retained in the latch circuit 31 is greater than the first set value or smaller than the second set value, a high-level signal Sa or Sd is input to the OR circuit 38 of the decision section 37, with the result that the semiconductor device 22 is determined to be defective, and a high-level output is obtained through the OR circuits 40 and 28. Conversely, when the combination data retained in the latch circuit 31 is greater than the second set value and smaller than the first set value, the high-level signals Sb and Sc are input to the NAND circuit 39 of the decision section 37, and the low-level signals Sa and Sd are input to the OR circuit 38, with the result that the semiconductor device 22 is determined to be nondefective and a low-level output is obtained through the OR circuits 40 and 28.

That is, a special determination, in which there exist expected values having a certain range, can be performed in one test and in real time.

At this point, a case where an output expected value of the semiconductor device 22 is $0100_2$ ($4_{10}$) and a predefined value is $\pm 2LSB$ will be explained in detail. An upper limit value $0110_2(6_{10})$ being a first set value and a lower limit value $0010_2(2_{10})$ being a second set value for determining whether a test device is defective are stored in the latch memories 35a and 35b, respectively.

Figure 2:
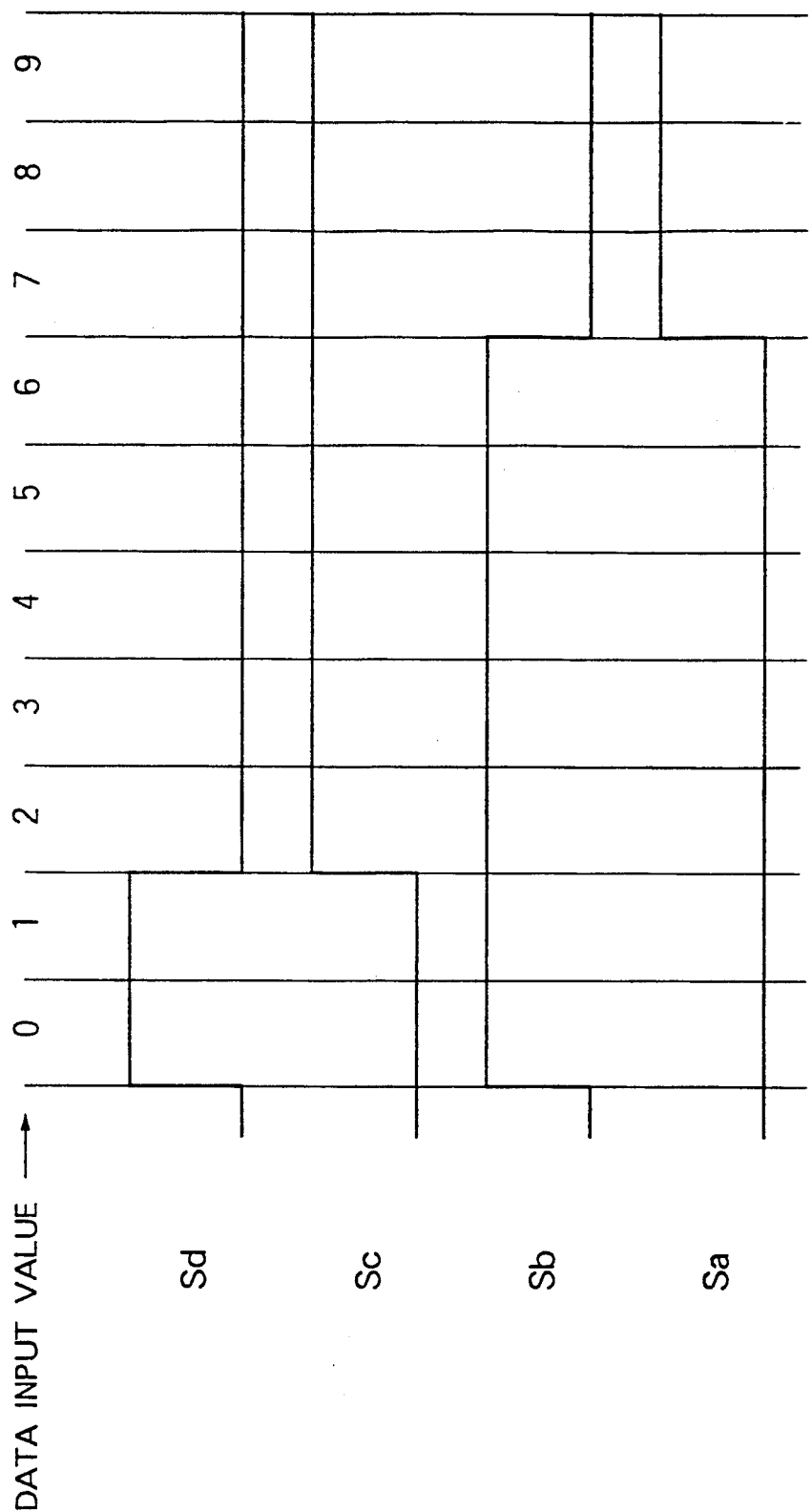
FIG. 2 is a signal waveform chart showing the operation of the embodiment.

At this time, the relationship between the combination data retained in the latch circuit 31, i.e., the A data input value $V_A$, and respective output signals Sa to Sd is as shown in FIG. 2.

In FIG. 2, when the combination data retained in the latch circuit 31, i.e., the A data input value $V_A$, is between $0010_2(2_{10})$ and $0110_2(6_{10})$, the output signals Sa and Sd become low level signals while the output signals Sb and Sc become high level signals. Therefore, the outputs of the OR circuit 38 and the NAND circuit 39 both become low level outputs, and the low-level output indicating that the device is not defective is obtained from the OR circuit 28. In contrast to this, when the A data input value $V_A$ is smaller than $0010_2(2_{10})$ or greater than $0110_2(6_{10})$, the output signal Sa or Sd becomes a high level signal. Therefore, the output of the OR circuit 38 becomes a high level output, and a high-level output indicating defective device is obtained from the OR circuit 28.

In the above-described embodiment, the first and second set values are output from the CPU 32, and they are stored in the latch memories 35a and 35b. The present invention is not limited to this case. A counter may be provided, and its count value may be taken to be the B data input value for the comparison circuits 36a and 36b.

The comparison circuits 36a and 36b may also be discrete components without using magnitude comparators.

In addition, in the above-described embodiment, the two comparison circuits 36a and 36b are arranged to make an upper and lower limit decision, respectively. However, three or more comparison circuits may be provided. If three or more comparison circuits are provided, a determination of whether a tested device is defective can be performed at many stages. For example, a determination with a predefined value $\pm 2LBS$ as well as of a predefined value $\pm 4LBS$ can be performed simultaneously in one test. The provision of many comparison circuits enables the testing of a plurality of semiconductor devices to be performed simultaneously.

In the above-described embodiment, instruction data is used for specifying whether or not the test is a usual one. However, in addition to this, the specifying may be performed by input from the CPU 32.

Also, the circuit shown in FIG. 1 may be incorporated into an interface board (a performance board) for semiconductor devices independently of an unillustrated test pattern supply circuit and memory in which a test program is stored.

What is claimed is:

1. A semiconductor test apparatus for testing the characteristics of a semiconductor device having a plurality of output pins comprising:

a plurality of level determination means, arranged in correspondence with respective output pins of a semiconductor device, for determining the output levels from the corresponding digital output pins and producing respective output signals in response to the determined output levels;

data preparation means for preparing combination data by selectively combining the output signals of said plurality of level determination means;

retaining means for retaining the combination data prepared by said data preparation means;

at least two storage means, each storage means for storing set values;

at least two comparison means, arranged in correspondence with respective storage means, for comparing combination data retained in said retaining means with the set values stored in the corresponding storage means;

determination means for determining the characteristics of said semiconductor device from comparison results in said comparison means; and selection means connected between said plurality of level determination means and said data preparation means, said selection means for outputting the output signals of said plurality of level determination means as the test result of said semiconductor test apparatus when said semiconductor test apparatus performs a test for specific expected values having no range and for outputting the outputs of said plurality of level determination means to said data preparation means when said semiconductor test apparatus perform a test for expected values having a certain range.

2. A semiconductor test apparatus as claimed in claim 1 wherein said storage means includes first and second latch memories for storing an upper limit value and a lower limit value of expected values having a certain range for determining the characteristics of said semiconductor device.

3. A semiconductor test apparatus as claimed in claim 2 wherein said comparison means includes first and second comparison circuits connected to said first and second latch memories, respectively, said determination means determining that a semiconductor device tested is nondefective only when said first and second comparison circuits indicate that combination data retained in said retaining means is between the upper limit value stored in the first latch memory and the lower limit value stored in the second latch memory.

4. A semiconductor test apparatus as claimed in claim 1 wherein said comparison means includes magnitude comparators.

* * * * *